United States Patent
Han et al.

(10) Patent No.: US 8,405,293 B2
(45) Date of Patent: Mar. 26, 2013

(54) FLAT PANEL DISPLAY APPARATUS AND MOTHER SUBSTRATE FOR FLAT PANEL DISPLAY APPARATUS

(75) Inventors: Byung-Uk Han, Yongin (KR); Oh-Seob Kwon, Yongin (KR); Sung-Soo Koh, Yongin (KR); Jung-Jun Im, Yongin (KR); Dong-Seop Park, Yongin (KR); Jae-Sang Ro, Seoul (KR); Seog-Young Lee, Seoul (KR); Won-Eui Hong, Seoul (KR)

(73) Assignees: Samsung Display Co., Ltd., Yongin, Gyeonggi-Do (KR); Ensil Tech Co., Ltd., Seoul (KR)

( * ) Notice: Subject to any disclaimer, the term of this patent is extended or adjusted under 35 U.S.C. 154(b) by 0 days.

(21) Appl. No.: 13/137,658

(22) Filed: Sep. 1, 2011

(65) Prior Publication Data

US 2012/0056523 A1    Mar. 8, 2012

(30) Foreign Application Priority Data

Sep. 2, 2010    (KR) .................. 10-2010-0086172

(51) Int. Cl.
*H01J 1/88* (2006.01)
*H01J 19/42* (2006.01)
*H01K 1/18* (2006.01)

(52) U.S. Cl. .......... 313/292; 313/498; 313/506; 313/512

(58) Field of Classification Search .......... 313/498–512, 313/292, 609
See application file for complete search history.

(56) References Cited

U.S. PATENT DOCUMENTS

| | | | |
|---|---|---|---|
| 2005/0116636 A1* | 6/2005 | Kang | 313/512 |
| 2005/0189878 A1* | 9/2005 | Shitagami et al. | 313/512 |
| 2007/0120480 A1* | 5/2007 | Kwon | 313/512 |
| 2008/0101146 A1 | 5/2008 | Paak et al. | |
| 2009/0134420 A1* | 5/2009 | Nagai | 257/98 |
| 2009/0218320 A1 | 9/2009 | Wang | |
| 2009/0218932 A1 | 9/2009 | Wang | |

FOREIGN PATENT DOCUMENTS

| | | |
|---|---|---|
| JP | 2000-223266 | 8/2000 |
| JP | 2000-252058 | 9/2000 |
| KR | 10-2001-0109011 A | 12/2001 |
| KR | 10-2001-0111846 A | 12/2001 |
| KR | 10-2003-0080895 A | 10/2003 |
| KR | 10-2006-0027543 A | 3/2006 |
| KR | 10-2006-0028212 A | 3/2006 |
| KR | 10-2006-0079615 A | 7/2006 |
| KR | 10-2009-0076659 A | 7/2009 |
| KR | 10-2009-0084147 A | 8/2009 |
| KR | 10-2010-0056752 A | 5/2010 |

* cited by examiner

*Primary Examiner* — Anh Mai
*Assistant Examiner* — Kevin Quarterman
(74) *Attorney, Agent, or Firm* — Lee & Morse, P.C.

(57) ABSTRACT

A flat panel display apparatus includes a first substrate having a display region, a second substrate facing the first substrate and bonded to the first substrate, a groove portion in an edge of at least one of the first substrate and the second substrate, and a wiring portion and a bonding member arranged in the groove portion. The bonding member contacts the wiring portion. The wiring portion is configured to receive power and to supply heat to the bonding member. The bonding member is configured to bond the first substrate and the second substrate using the heat supplied from the wiring portion disposed in the groove portion.

22 Claims, 9 Drawing Sheets

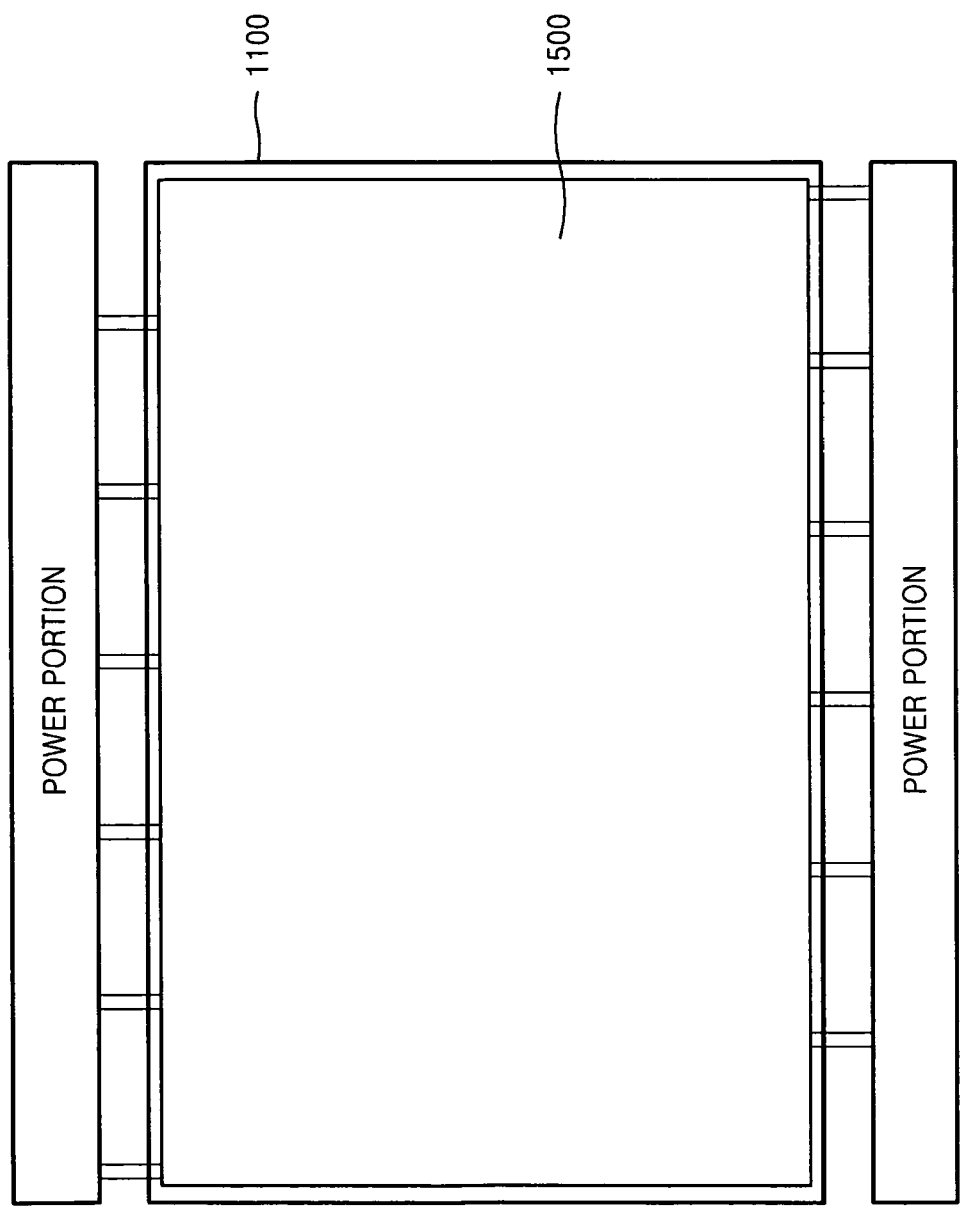

FLAT PANEL DISPLAY APPARATUS AND MOTHER SUBSTRATE FOR FLAT PANEL DISPLAY APPARATUS

BACKGROUND

1. Field

Embodiments relate to a flat panel display apparatus and a mother substrate for a flat panel display apparatus.

2. Description of the Related Art

When manufacturing flat panel display apparatuses, a sealing process may be performed to achieve, e.g., air-tightness of the flat panel display apparatuses. The sealing process may be performed by coating a bonding material between a lower substrate and an upper substrate, and melting the lower substrate and an upper substrate by using a laser.

SUMMARY

Embodiments are directed to a flat panel display apparatus and a mother substrate for a flat panel display apparatus.

Embodiments may be realized by providing a flat panel display apparatus on which is performed a sealing process by using Joule heat generated from a wiring portion and includes the wiring portion within a groove portion so as to increase an adhesive force between a bonding member and a substrate, and a mother substrate for the flat panel display apparatus.

Embodiments may also be realized by providing a flat panel display apparatus that includes a first substrate having a display region, and a second substrate facing the first substrate and being bonded to the first substrate. A groove portion in an edge of at least one of the first substrate and the second substrate; and a wiring portion and a bonding member arranged in the groove portion, the bonding member contacting the wiring portion. The wiring portion is configured to receive power and to supply heat to the bonding member, and the bonding member is configured to bond the first substrate and the second substrate when the heat is supplied from the wiring portion.

The groove portion may include a first groove portion formed in the edge of the first substrate and a second groove portion formed in the edge of the second substrate, wherein the wiring portion is disposed in the first groove portion and the second groove portion.

The apparatus may further include an intermediate layer formed between the wiring portion and the bonding member.

A miniature structure may be formed on the surface of the groove portion.

The wiring portion may include an additional wiring portion connected to a power portion that applies the power.

A groove or trench corresponding to the additional wiring portion may be formed in the first substrate and the second substrate.

A light emitting portion may be disposed in the display region, wherein the flat panel display apparatus is an organic light emitting display apparatus.

The wiring portion may include a plurality of wiring members, wherein the wiring member are spaced apart from each other.

The wiring portion may include a plurality of wiring members that are spaced apart from each other, wherein the at least one wiring member disposed in the first groove portion and the at least one wiring member disposed in the second groove portion cross each other.

The wiring portion may include a plurality of wiring members that are spaced apart from each other, wherein the at least one wiring member disposed in the first groove portion and the at least one wiring member disposed in the second groove portion face each other.

The at least one wiring member may be disposed in a bottom surface and sidewall of the groove portion.

The apparatus may further include an intermediate layer covering the at least one wiring member, wherein the bonding member contacts the intermediate layer.

Embodiments may also be realized by providing a plurality of display portions, a plurality of groove portions in edges of the plurality of display portions, and a plurality of wiring portions arranged in the plurality of groove portions, the plurality of wiring portions being configured to receive power and to apply heat to a plurality of bonding members. The plurality of wiring portions include a plurality of additional wiring portions, and the additional wiring portions being connected to a power portion that is configured to apply the power or being connected to adjacent wiring portions.

The mother substrate may further including a plurality of bonding members disposed in the plurality of groove portions, contacting the plurality of wiring portions, and bonding the mother substrate for the flat panel display apparatus and the facing substrate by using the heat supplied from the plurality of wiring portions.

Grooves or trenches corresponding to the plurality of additional wiring portions may be formed in the mother substrate for the flat panel display apparatus.

The mother substrate may further include a plurality of intermediate layers between the plurality of wiring portions and the plurality of bonding members.

A plurality of minute structures may be formed on the surfaces of the plurality of groove portions.

The mother substrate for the flat panel display apparatus may be a mother substrate for an organic light emitting display apparatus.

The plurality of wiring portions may include at least one wiring member, wherein the at least one wiring member are spaced apart from each other.

The at least one wiring member may be disposed in bottom surfaces and sidewalls of the plurality of groove portions.

The mother substrate may further include a plurality of intermediate layers covering the at least one wiring member, wherein the plurality of bonding members contacts the plurality of intermediate layers.

BRIEF DESCRIPTION OF THE DRAWINGS

Features will become more apparent to those of ordinary skill in the art by describing in detail exemplary embodiments with reference to the attached drawings, in which:

FIG. 15 illustrates a plan view of the mother substrate for the flat panel display apparatus of FIG. 14 and a substrate facing the mother substrate in a bonding state, according to an exemplary embodiment.

DETAILED DESCRIPTION

Figure 1:
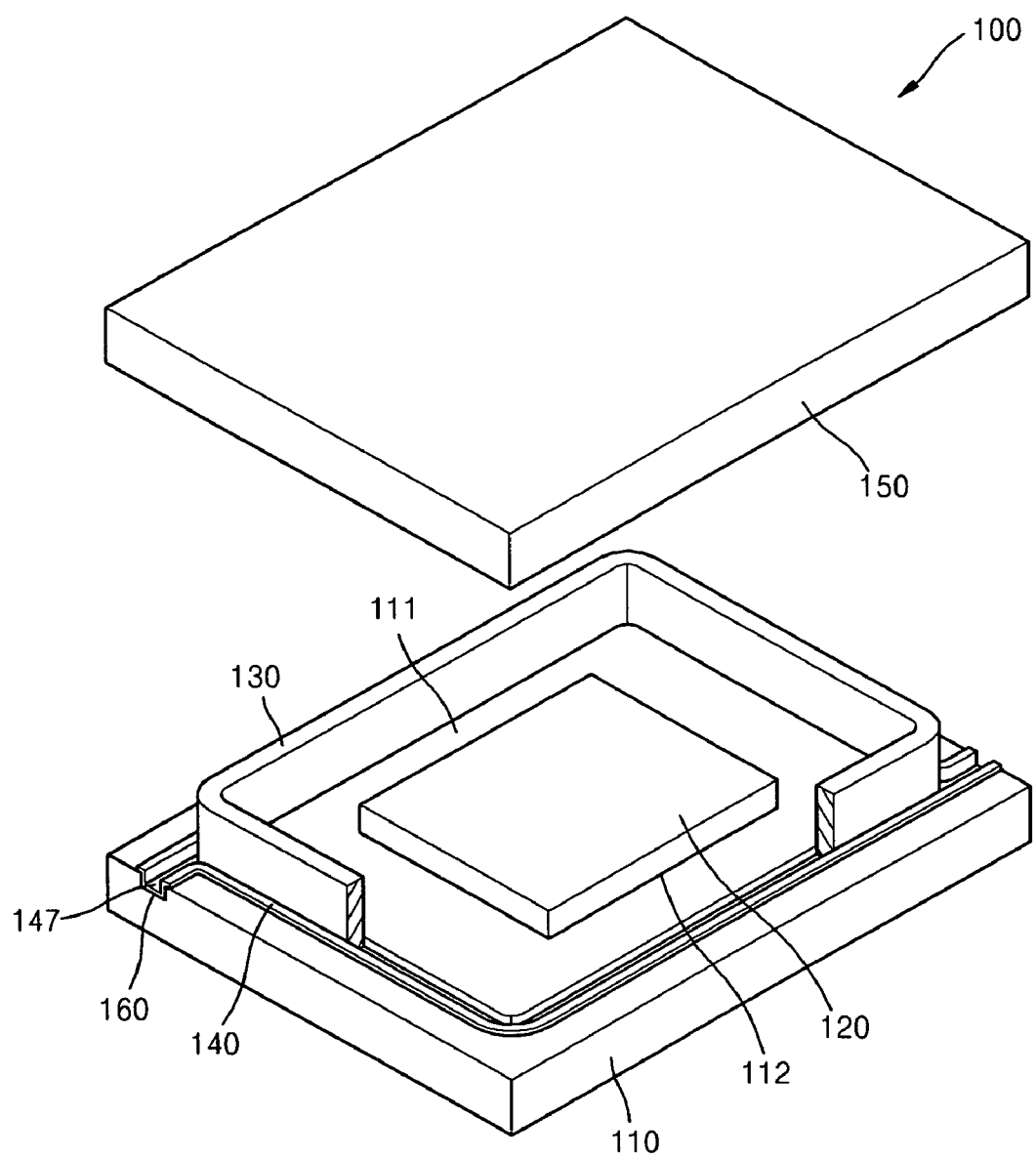
FIG. 1 illustrates a perspective view of a flat panel display apparatus according to an exemplary embodiment.

Korean Patent Application No. 10-2010-0086172, filed on Sep. 2, 2010, in the Korean Intellectual Property Office, and entitled: "Flat Panel Display Apparatus and Mother Substrate for Flat Panel Display Apparatus," is incorporated by reference herein in its entirety.

Example embodiments will now be described more fully hereinafter with reference to the accompanying drawings; however, they may be embodied in different forms and should not be construed as limited to the embodiments set forth herein. It is to be appreciated that all changes, equivalents, and substitutes that do not depart from the spirit and technical scope of the present invention are encompassed in the exemplary embodiments. As the present invention allows for various changes and numerous embodiments, exemplary embodiments will be illustrated in the drawings and described in detail in the written description. These embodiments are provided so that this disclosure will be thorough and complete, and will fully convey the scope of the invention to those skilled in the art.

While such terms as "first," "second," etc., may be used to describe various components, such components must not be limited to the above terms. The above terms are used only to distinguish one component from another. Further, an expression used in the singular encompasses the expression of the plural, unless it has a clearly different meaning in the context. It is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
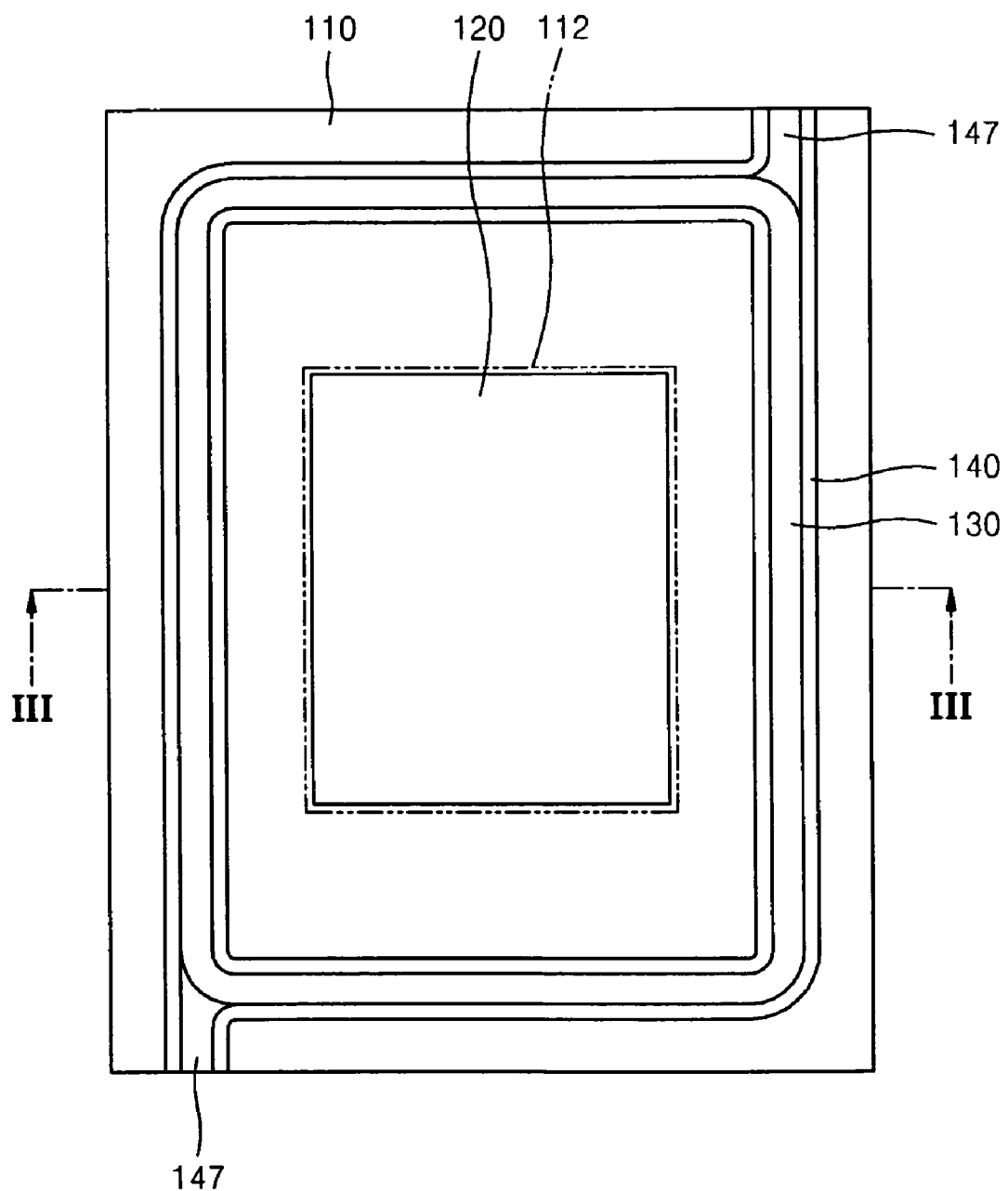
FIG. 2 illustrates a plan view of the flat panel display apparatus of FIG. 1.
Figure 3:
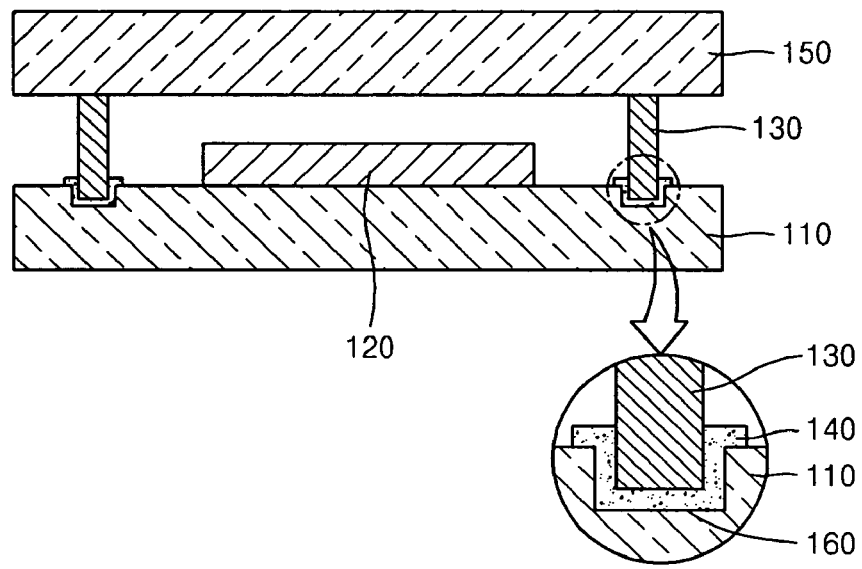
FIG. 3 illustrates a cross-sectional view taken along a line of FIG. 2.

FIG. 1 illustrates a perspective view of a flat panel display apparatus 100 according to an exemplary embodiment. FIG. 2 illustrates a plan view of the flat panel display apparatus 100 of FIG. 1. FIG. 3 illustrates a cross-sectional view taken along a line III-III of FIG. 1.

Referring to FIGS. 1 through 3, the flat panel display apparatus 100 of the present embodiment may include a substrate 110, a light emitting unit 120, a bonding member 130, a groove portion 160, a wiring portion 140, and a second substrate 150.

The first substrate 110 and the second substrate 150 may face each other, and may be sealed by using the bonding member 130. The bonding member 130 may be disposed between, e.g., directly between, overlapping portions of the front substrate 110 and the second substrate 150.

The first substrate 110 may be partitioned by a non-display region 111 and a display region 112. The light emitting portion 120 may be disposed in the display region 112. The display region 112 may be disposed, e.g., in a center of the first substrate 110. The non-display region 111 may be disposed in an edge of the first substrate 110, e.g., around an outer periphery of the of the display region 112. The light emitting portion 120 will be described later. The first substrate 110 may be formed of, e.g., an insulation material or a metal material. The insulation material may use, e.g., glass or plastic. The metal material may use, e.g., stainless steel (SUS).

Referring to FIG. 3, the first substrate 110 may include the groove portion 160. For example, the groove portion 160 may be formed along the edge of the first substrate 110. The groove portion 160 may be formed in the non-display region 111. The groove portion 160 may surround, e.g., substantially entirely surround, the display region 112. The groove portion 160 may be formed in the non-display region 111 where the bonding member 130 is to be formed. When the bonding member 130 is formed, at least a portion of the bonding member 130 may be accommodated in the groove portion 160. The groove portion 160 may be formed in the first substrate 110 by using, e.g., a sand blast method or an etching method.

The groove portion 160 may have a flat bottom cross-section. However, the embodiments not limited thereto. For example, the groove portion 160 may have a curved bottom cross-section. In an exemplary embodiment, a microstructure, e.g., a minute structure, may be formed on the surface of the groove portion 160. The minute structure may be in a concavo-convex or protrusion shape. The minute structure may be formed by using the etching method. The minute structure may maximize a contact area between the groove portion 160 and the wiring portion 140 formed in the groove portion 160 to, e.g., achieve an effect of interface improvement. The wiring portion 140 will be described later.

A depth of the groove portion 160 may be determined according to a height of the bonding member 130. For example, if the groove portion 160 has a large depth, the bonding member 130 may be deeply buried in the groove portion 160, and thus one surface of the second substrate 150 and the light emitting portion 120 may contact each other. Therefore, the groove portion 160 may be formed in such a way that the second substrate 150 and the light emitting portion 120 do not contact each other when the first substrate 110 and the second substrate 120 are bonded to each other.

Referring to FIG. 3, the wiring portion 140 may be disposed within, e.g., embedded at least partially inside, the groove portion 160. The wiring portion 140 may be formed on the sidewalls and a bottom surface of the groove portion 160. For example, a middle portion of the wiring portion 140 may be seating inside the groove portion 160, and lateral end portions of the writing portion 140 may be seated on an upper surface of the first substrate 110. The wiring portion 140 may be formed along the edge of the first substrate 110. For example, the wiring portion 140 may be formed in the non-display region 111 to surround, e.g., substantially entirely surround, the display region 112. The wiring portion 140 may be formed in the non-display region 111 where the bonding member 130 is to be formed. The wiring portion 140 may supply heat to the bonding member 130. The bonding member 130 may be accommodated in the groove portion 160 so that the bonding member 130 contacts the wiring portion 140.

The wiring portion 140 may be configured to generate heat when power is supplied to the wiring portion 140. The wiring portion 140 may be formed of a conductive metal material.

The conductive metal material may use, e.g., an alloy formed of two or more elements. The alloy may include at least two of silver (Ag), copper (Cu), nickel (Ni), manganese (Mn), and molybdenum (Mo). The wiring portion 140 may be formed by using, e.g., various methods including deposition, coating, etc.

An upper portion of the wiring portion 140 may contact a lower end of the bonding member 130. The wiring portion 140 may surround lateral sides of a lower portion of the bonding member 130. The upper portion of the wiring member 140 may have, e.g., a flat cross-sectional shape. However, the embodiments are not limited thereto. For example, the upper portion of the wiring portion 140 may have a curved cross-sectional shape.

The wiring portion 140 may only be formed within the groove portion 160. However, the embodiments are not limited thereto. For example, the wiring portion 140 may extend outside the groove portion 160, e.g., as shown in FIG. 3. The wiring portion 140 formed within the groove portion 160 may have a uniform thickness. However, the embodiments are not limited thereto. For example, a thickness of the wiring portion 140 adjacent to the bottom of the groove portion 160 may be different from a thickness of the wiring portion 140 adjacent to the side surface of the groove portion 160.

According to an exemplary embodiment, the wiring portion 140 may include a plurality of wiring members 141. The wiring members 141 may be spaced apart from each other, e.g., in a region where the wiring members 141 and the bonding member 130 overlap. To this end, the wiring members 141 may be spaced apart from each other. For example, the wiring members 141 of the wiring portion 140 may be disposed in a first groove portion 161 of the first substrate 110 and a second groove portion 162 of the second substrate 150. The bonding member 130 may be disposed in an upper portion of each of the wiring members 141 and in spaces where the wiring members 141 are spaced apart from each other. The bonding member 130 may be arranged in an area surrounded by wiring members 141.

The wiring portion 140 may generate heat when an external power portion supplies power to the wiring portion 140, and thus the flat panel display apparatus 100 may further include an additional wiring portion 147. The additional wiring portion 147 may be used to connect the wiring portion 140 and the external power portion. As such, the additional wiring portion 147 may be coupled to both the wiring portion 140 and the external power portion. The additional wiring portion 147 may be formed by, e.g., extending the wiring portion 140 or connecting another wire to the wiring portion 140. The additional wiring portion 147 may extend from the wiring portion 140 by, e.g., about 1 mm and about 3 mm to contact an electrode of the external power portion. The additional wiring portion 147 may be formed of a conductive metal material. The additional wiring portion 147 may be formed of the same material as or different materials from the wiring portion 140.

Referring to FIGS. 1 and 2, two additional wiring portions 147 may extend upward and downward, respectively, from the wiring portion 140 in a rectangular shape formed in the edge of the first substrate 110. However, the embodiments are not limited thereto. For example, the number of the additional wiring portion 147 may be 1 or 3 or more. The location of the additional wiring portion 147 is not limited as shown in FIG. 2. For example, the additional wiring portion 147 may be formed in at least one of a left direction, a right direction, and a diagonal direction of the wiring portion 140. The additional wiring portion 147 may be formed in, e.g., a groove or trench similarly to the wiring portion 140. In this regard, the groove or trench may extend from the groove portion 160 in which the wiring portion 140 is formed. For example, the groove or trench including the additional wiring portion 147 may be continuous, e.g., form a continuous groove, with the groove portion 160. However, the embodiments are not limited thereto. For example, the groove or trench may be separated, e.g., may form grooves spaced apart, from the groove portion 160 in which the wiring portion 140 is formed.

The bonding member 130 may contact the wiring portion 140 formed in the groove portion 160. Without intending to be bound by this theory, the bonding member 130 may be used to bond the first substrate 110 and the second substrate 150 by using, e.g., Joule heat supplied from the wiring portion 140.

The bonding member 130 may be formed of, e.g., a thermal baking material. For example, the bonding member 130 may be a glass frit including, e.g., formed of, at least one of MgO, CaO, BaO, $Li_2O$, $Na_2O$, $K_2O$, $B_2O_3$, $V_2O_5$, ZnO, $TeO_2$, $Al_2O_3$, $SiO_2$, PbO, SnO, $P_2O_5$, $Ru_2O$, $Rh_2O$, $Fe_2O_3$, CuO, $TiO_2$, $WO_3$, $Bi_2O_3$, $Sb_2O_3$, lead-borate glass, tin-phosphate glass, Vanadate glass, and borosilicate glass.

The second substrate 150 may be an encapsulation substrate that faces the first substrate 110. The second substrate 150 may seal elements formed on the first substrate 110. The first substrate 110 and the second substrate 150 may be bonded to each other by using the bonding member 130. The second substrate 150 may be formed of, e.g., transparent glass. The entire surface of the second substrate 150 may have a flat shape and be disposed parallel to the surface of the first substrate 110.

Other exemplary embodiments will now be described with reference to FIGS. 4 through 8.

Figure 4:
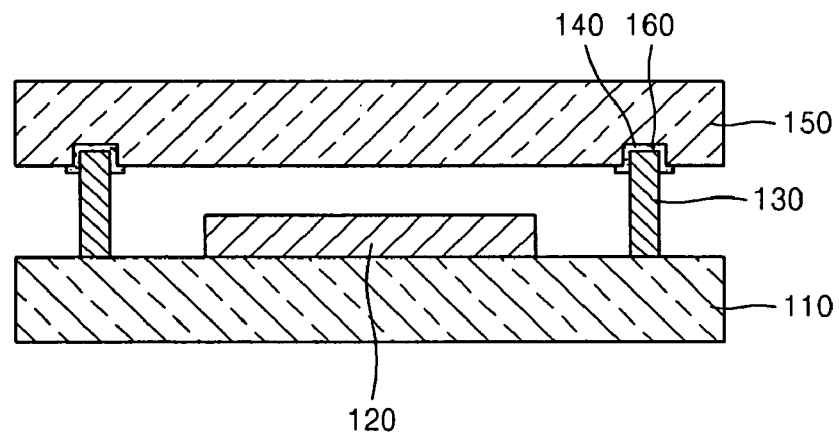
FIGS. 4 through 12 illustrate cross-sectional views of a flat panel display apparatus according to exemplary embodiments.

FIG. 4 illustrates a cross-sectional view of the flat panel display apparatus 100 according to another exemplary embodiment. Referring to FIG. 4, the flat panel display apparatus 100 in which the groove portion 160 and the wiring portion 140 are not formed in the first substrate 110 is different from the flat panel display apparatus 100 shown in FIG. 3. In particular, the groove portion 160 and the wiring portion 140 may be formed in the second substrate 150. As illustrated in FIG. 4, the bonding member 130 may be disposed in the groove portion 160 formed in the second substrate 150. The other elements of the flat panel display apparatus 100 of the present embodiment may be the same as or similar to the corresponding elements of the flat panel display apparatus 100 shown in FIG. 3, and thus detailed descriptions thereof will not be repeated here. Although not shown, the additional wiring portion 147 and a groove or trench corresponding to the additional wiring portion 147 may be formed in the second substrate 150.

Figure 5:
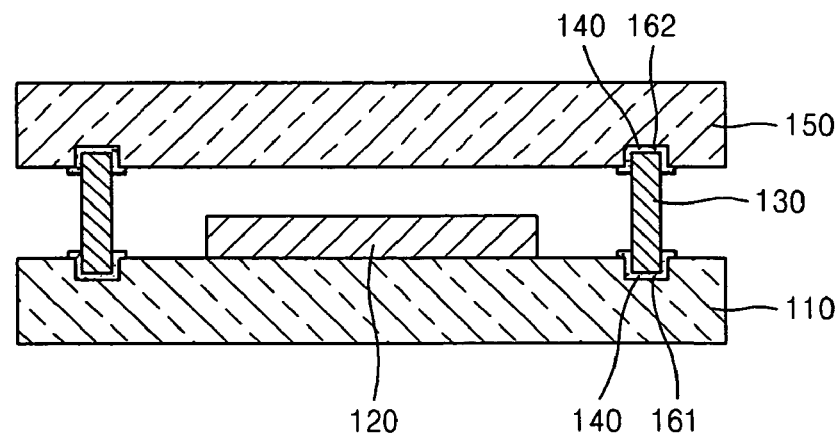

FIG. 5 illustrates a cross-sectional view of the flat panel display apparatus 100 according to another exemplary embodiment. Referring to FIG. 5, compared to the flat panel display apparatus 100 shown in FIGS. 3 and 4, the groove portions 160 and the wiring portions 140 may be formed in both the first substrate 110 and the second substrate 150. The bonding member 130 may be disposed in the groove portions 160 formed in both the first substrate 110 and the second substrate 150. The bonding member 130 may be disposed between two opposing wiring portions 140.

A vertical temperature variation of a bonding member 130 is a profile of a temperature when the bonding member 130 is, e.g., cut in a vertical direction with respect to the first substrate 110. Without intending to be bound by this theory, embodiments including the wiring portion 140 formed in the first substrate 110 or the second substrate 150, e.g., as shown in FIGS. 3 and 4, may have a uniform vertical temperature variation profile in the bonding member 130. The wiring portions 140 formed in both the first substrate 110 and the second substrate 150, e.g., as shown in FIG. 5, may have a more uniform variation of a vertical temperature profile in the bonding member 130. For example, an embodiment as shown in FIG. 5, may have a temperature difference between a lower side of the bonding member 130 that is closer to the first substrate 110 and an upper side of the bonding member 130 that is closer to the second substrate 150 that may be merely about 0.03° C. In embodiments as shown in FIGS. 3 and 4, a temperature difference between the lower side of the bonding member 130 that is closer to the first substrate 110 and the upper side of the bonding member 130 that is closer to the second substrate 150 may be about 62° C. Without intending to be bound by this theory, the bonding member 130 of FIG. 5 may have a more uniform temperature distribution profile. Thus, the flat panel display apparatus 100 may more firmly perform a sealing process by efficiently melting the bonding member 130.

Furthermore, a time taken to maintain a temperature for melting the bonding member 130 of FIG. 5 may be longer than that of FIGS. 3 and 4. For example, the time taken to maintain the temperature for melting the bonding member 130 of FIG. 5 may be about 15.44 ms, whereas the time taken to maintain the temperature for melting the bonding member 130 of FIGS. 3 and 4 may be about 11.51 ms. Without intending to be bound by this theory, the time taken to maintain the temperature for melting the bonding member 130 of FIG. 5 may be longer than that of FIGS. 3 and 4, thereby effectively performing a sealing process.

A groove formed in the edge of the first substrate 110 may indicate the first groove portion 161. A groove formed in the edge of the second substrate 150 may indicate the second groove portion 162. The wiring portions 140 may be disposed in the first groove portion 161 and the second groove portion 162. The other elements of the flat panel display apparatus 100 may be the same as or similar to the corresponding elements of the flat panel display apparatus 100 shown in FIGS. 3 and 4, and thus the detailed descriptions thereof will not be repeated here. Although not shown, the additional wiring portion 147 and a groove or trench corresponding to the additional wiring portion 147 may be formed in the surface of the first substrate 110 or the second substrate 150.

Figure 6:
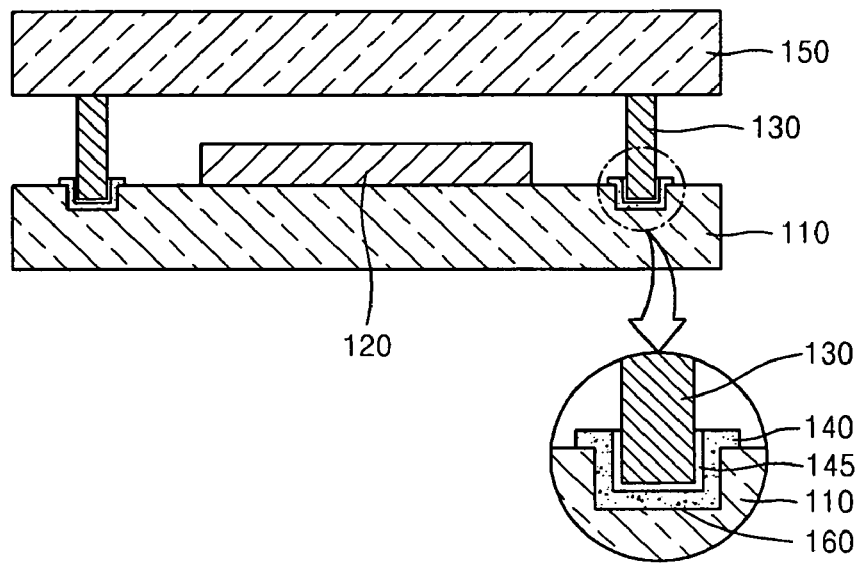

FIG. 6 illustrates a cross-sectional view of the flat panel display apparatus 100 according to another exemplary embodiment. The flat panel display apparatuses 100 shown in FIGS. 3 and 6 may be the same as each other in that the groove portion 160 and the wiring portion 140 are formed in the first substrate 110. However, an intermediate layer 145 is further formed in the wiring portion 140 of the flat panel display apparatus 100 of FIG. 6. The other elements of the flat panel display apparatus 100 of the present embodiment may be the same as or similar to the corresponding elements of the flat panel display apparatus 100 shown in FIG. 3, and thus detailed descriptions thereof will not be repeated here.

Referring to FIG. 6, the intermediate layer 145 may be formed in the wiring portion 140 in such a way that the intermediate layer 145 is disposed between, e.g., directly between, the wiring portion 140 and the bonding portion 130. The intermediate layer 145 may be used to efficiently transfer heat generated from the wiring portion 140 to the bonding member 130. The intermediate layer 145 may be formed of a metal material having a high thermal conductivity. The metal material of the intermediate layer 145 may use any one or an alloy, e.g., formed of two or more of gold (Au), silver (Ag), copper (Cu), nickel (Ni), and aluminum (Al). The intermediate layer 145 may be formed of the same material as or different materials from the wiring portion 140.

The intermediate layer 145 may increase a bonding force between the wiring portion 140 and the bonding member 130, and may be formed of an insulator to prevent the wiring portion 140 from being oxidized due to high heat. The material of the intermediate layer 145 may include at least one of, e.g., silicon oxide, silicon nitride, silicon oxynitride, aluminum oxide, and titanium oxide. The intermediate layer 145 may be formed by using various methods including, e.g., deposition, coating, etc.

The upper portion of the intermediate layer 145 that contacts the bonding member 130 may have a flat cross-sectional shape. However, the embodiments are not limited thereto. For example, the upper portion of the intermediate layer 145 may have a curved cross-sectional shape. The intermediate layer 145 may only be formed within the groove portion 160. However, the embodiments are not limited thereto. For example, the intermediate layer 145 may extend outside the groove portion 160 as shown in FIG. 6. The intermediate layer 145 formed within the groove portion 160 may have a uniform thickness. However, the embodiments are not limited thereto. For example, a thickness of the intermediate layer 145 formed on the wiring portion 140 adjacent to the bottom of the groove portion 160 may be different from that of the intermediate layer 145 formed on the wiring portion 140 adjacent to the side surface of the groove portion 160.

Figure 7:
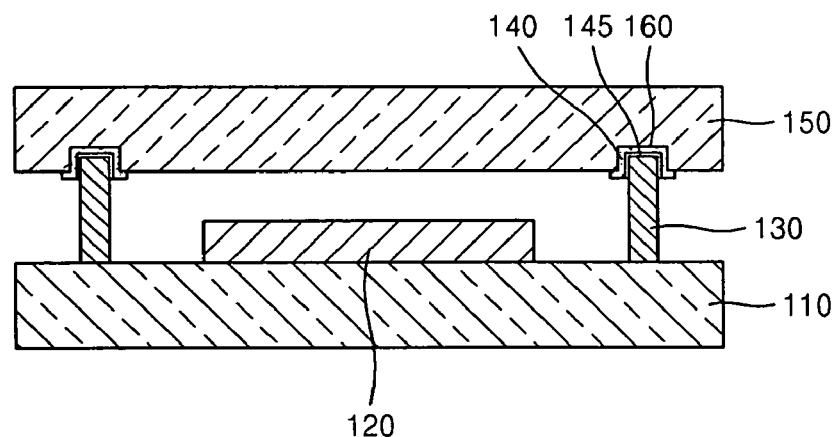

FIG. 7 illustrates a cross-sectional view of the flat panel display apparatus 100 according to another exemplary embodiment. The flat panel display apparatuses 100 shown in FIGS. 4 and 7 may be the same as each other in that the groove portion 160 and the wiring portion 140 are formed in the second substrate 150. However, the intermediate layer 145 may be formed in the wiring portion 140 of the flat panel display apparatus 100 of FIG. 7. The other elements of the flat panel display apparatus 100 of the present embodiment may be the same as or similar to the corresponding elements of the flat panel display apparatus 100 shown in FIG. 4, and thus detailed descriptions thereof will not be repeated here.

Figure 8:
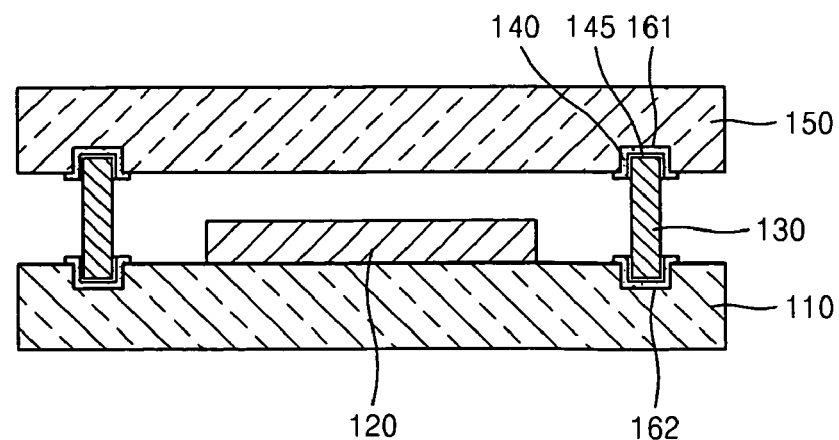

FIG. 8 illustrates a cross-sectional view of the flat panel display apparatus 100 according to another exemplary embodiment. The flat panel display apparatuses 100 shown in FIGS. 5 and 8 may be the same as each other in that the groove portions 160 and the wiring portions 140 are formed in the first substrate 110 and the second substrate 150. However, the intermediate layer 145 is further formed in the wiring portion 140 of the flat panel display apparatus 100 of FIG. 8. The other elements of the flat panel display apparatus 100 of the present embodiment may be the same as or similar to the corresponding elements of the flat panel display apparatus 100 shown in FIG. 5, and thus detailed descriptions thereof will not be repeated here.

Figure 9:
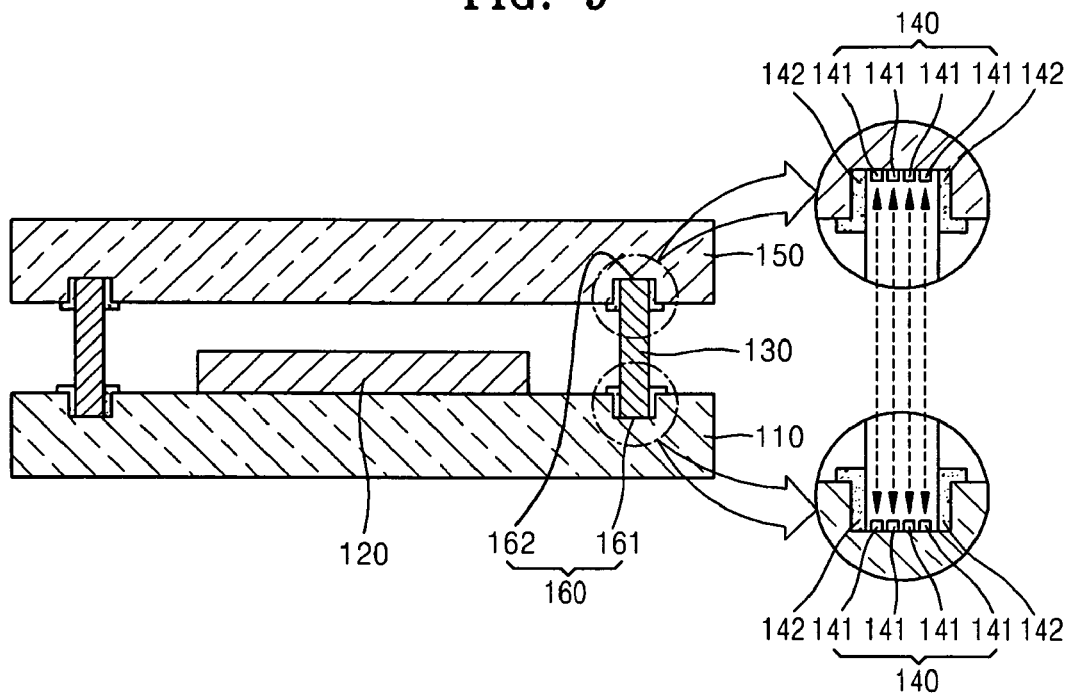
Figure 10:
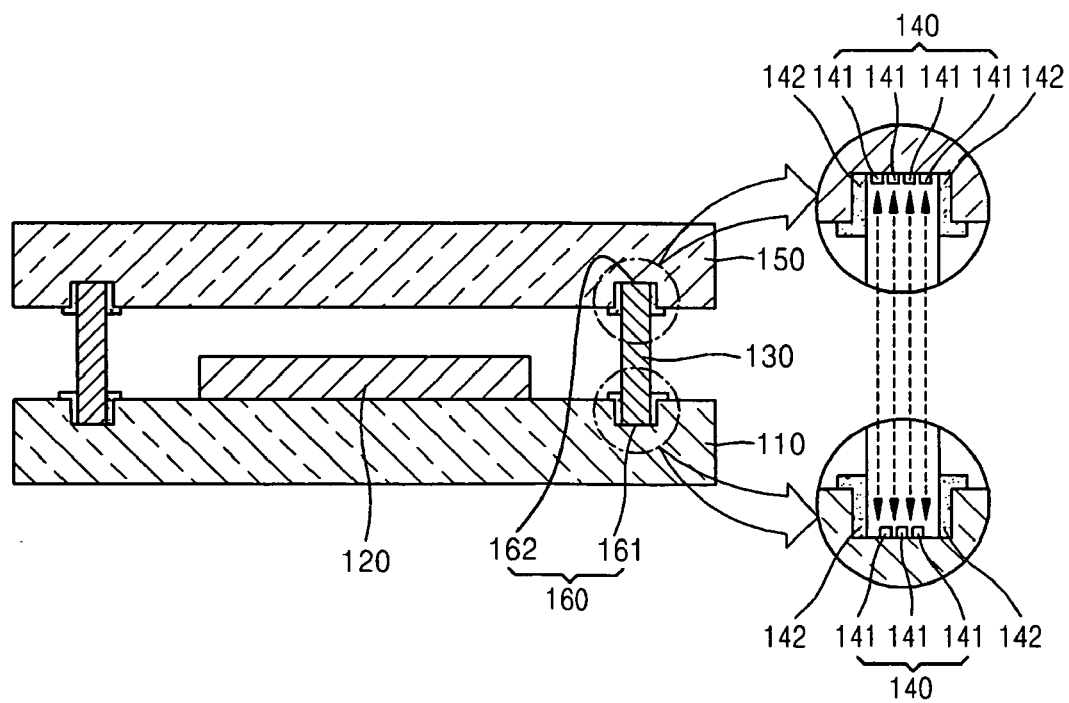

FIGS. 9 and 10 illustrate cross-sectional views of the flat panel display apparatus 100 according to another exemplary embodiment. The flat panel display apparatuses 100 shown in FIGS. 5, 9, and 10 may be the same as each other in that the groove portions 160 and the wiring portions 140 are formed in the first substrate 110 and the second substrate 150. FIGS. 9 and 10 illustrate the wiring portion 140 of the flat panel display apparatus 100 of FIGS. 9 and 10 including the wiring portions 141. The other elements of the flat panel display apparatus 100 of the present embodiment may be the same as or similar to the corresponding elements of the flat panel display apparatus 100 shown in FIG. 5, and thus detailed descriptions thereof will not be repeated here.

The wiring members 141 may be spaced apart from each other in a region where the wiring members 141 and the bonding members 130 overlap. To this end, the wiring members 141 may be spaced apart from each other. For example, the wiring members 141 of the wiring portion 140 may be disposed in both the first groove portion 161 of the first substrate 110 and the second groove portion 162 of the second substrate 150. The wiring members 141 may be formed in only one of the first groove portion 161 and the second groove portion 162. The bonding member 130 may be disposed in an upper portion and side surface of each of the wiring members 141 and in spaces where the wiring members 141 are spaced apart from each other. The wiring members 141 may include a bundle of wirings that are not formed in sidewalls of the first groove portion 161 and the second groove portion 162, and the wiring portion 140 may be integrally formed to surround the sidewalls of the first groove portion 161 and the second groove portion 162. Without intending to be bound by this theory, the bonding member 130 may contact, e.g., directly contact, the first substrate 110 and the second substrate 150 in the spaces where the wiring members 141 are spaced apart from each other, thereby durability of the bonding member 130 may be improved and the coupling characteristics between the where the first substrate 110 and the second substrate 150 may be improved.

Referring to FIG. 9, the wiring members 141 disposed in the first groove portion 161 and the wiring members 141 disposed in the second groove portion 162 may face to each other. Referring to FIG. 10, the wiring members 141 disposed in the first groove portion 161 and the wiring members 141 disposed in the second groove portion 162 may cross each other.

The wiring members 141 of the wiring portion 140 will now be described in more detail. The wiring members 141 may be disposed on, e.g., directly on, the bottom surface of at least one of the first groove portion 161 and the second groove portion 162. The wiring portion 140 may surround the wiring members 141 in the at least one of the first groove portion 161 and the second groove portion 162. When power is applied to the wiring portion 140 after the bonding member 130 is disposed, each of the wiring members 141 may generate Joule heat. Without intending to be bound by this theory, the bonding member 130 may be melted by the Joule heat. Thereafter, the bonding member 130 may be hardened so that the first substrate 110 and the second substrate 150 are coupled to each other.

In an embodiment including the wiring portion 140 formed in a single body to have a thickness corresponding to, e.g., a thickness of the bonding member 130, when power is applied to the wiring portion 140, the center of the wiring portion 140 may be more heated than the boundary thereof. A temperature non-uniformity may occur in, e.g., the center and/or the boundary of the bonding member 130 with respect to a width of the bonding member 130. For example, a temperature of the center of the bonding member 130 may be greater than the boundary thereof with respect to the width of the bonding member 130. Accordingly, without intending to be bound by this theory, the bonding member 130 may be non-uniformly melted and hardened, which may reduce a durability of the bonding member 130. When the wiring portion 140 includes the wiring members 141 that are spaced apart from each other, each of the wiring members 141 may generate the Joule heat. Without intending to be bound by this theory, the wiring portion 140 including the wiring members 141 may reduce and/or prevent the temperature non-uniformity between the center and the boundary of the bonding member 130 from occurring.

Figure 11:
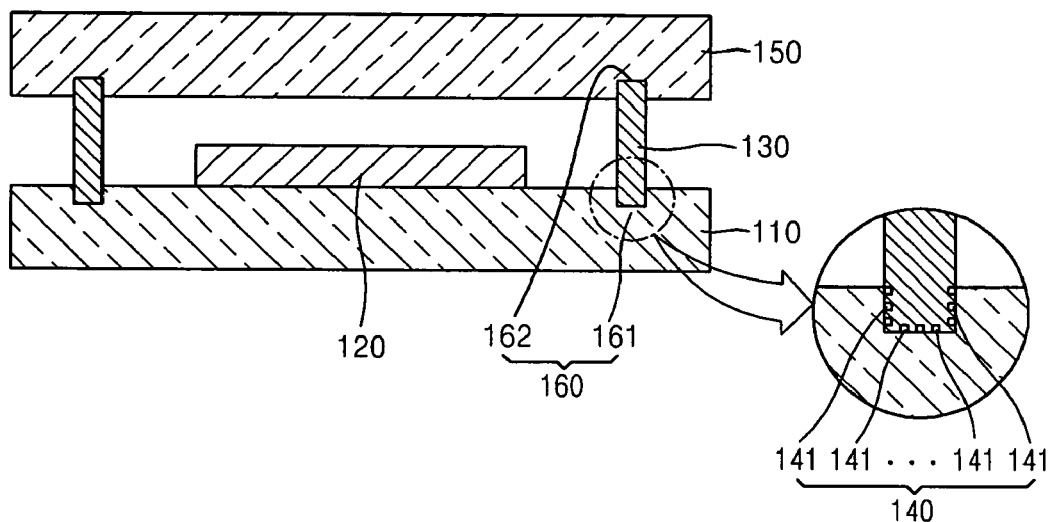

FIG. 11 illustrates a cross-sectional view of the flat panel display apparatus 100 according to another exemplary embodiment. The flat panel display apparatuses 100 shown in FIGS. 9, 10, and 11 may be the same as each other in that the groove portion 160 and the wiring portion 140 including the wiring portions 141 are formed in one of or both the first substrate 110 and the second substrate 150. However, the wiring portions 141 of the flat panel display apparatus 100 of FIG. 11 are formed along the bottom surface and sidewalls of the groove portion 160. The other elements of the flat panel display apparatus 100 of the present embodiment may be the same as or similar to the corresponding elements of the flat panel display apparatus 100 shown in FIGS. 9 and 10, and thus detailed descriptions thereof will not be repeated here.

The wiring portion 140 includes the wiring portions 141 so that the bonding portion 130 contacts the first substrate 110 and the second substrate 150 in spaces where the wiring members 141 are spaced apart from each other over the bottom surface and sidewalls of the groove portion 160. Without intending to be bound by this theory, the durability of the bonding member 130 and the coupling characteristics of the bonding member 130 and the first substrate 110 and the second substrate 150 may be further improved.

Figure 12:
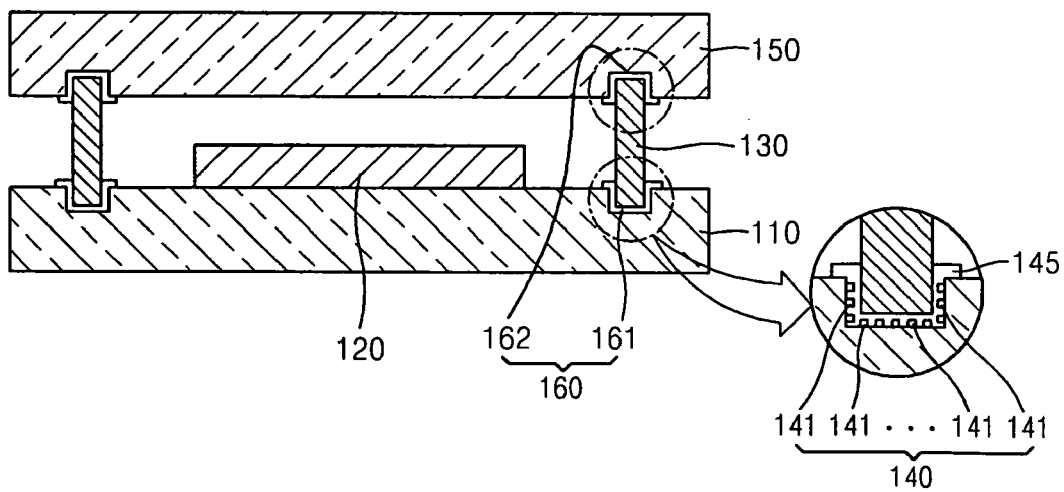

FIG. 12 illustrates a cross-sectional view of the flat panel display apparatus 100 according to another exemplary embodiment. The flat panel display apparatuses 100 shown in FIGS. 11 and 12 may be the same as each other in that the groove portion 160 and the wiring portion 140 including the wiring portions 141 are formed in one of or both the first substrate 110 and the second substrate 150. However, the flat panel display apparatus 100 of FIG. 12 further includes the intermediate layer 145 that covers the wiring members 141. An exemplary embodiment includes the bonding member 130 being spaced apart, e.g., not contacting, the wiring members 141 but being arranged flush with, e.g., contacting, the intermediate layer 145. The other elements of the flat panel display apparatus 100 of the present embodiment may be the same as or similar to the corresponding elements of the flat panel display apparatus 100 shown in FIG. 11, and thus detailed descriptions thereof will not be repeated here.

The intermediate layer 145 may cover outer surfaces of the wiring members 141 and be formed in spaces where the wiring members 141 are spaced apart from each other. For example, the wiring members 141 may be under the intermediate layer 145. The intermediate layer 145 may be used to transfer heat generated from the wiring members 141 to the bonding member 130. The intermediate layer 145 may limit and/or not allow the wiring members 141 and the bonding member 130 to contact each other. The intermediate layer 145 may be formed as an insulator in order to increase a bonding force between the wiring members 141 and the bonding member 130 and to reduce and/or prevent the wiring members 141 from being oxidized due to high heat. The material of the intermediate layer 145 may include at least one of, e.g., silicon oxide, silicon nitride, silicon oxynitride, aluminum oxide, and titanium oxide. The intermediate layer 145 may be formed by using various methods including, e.g., deposition, coating, etc.

A structure of the light emitting portion 120 disposed on the first substrate 110 will now be described.

Figure 13:
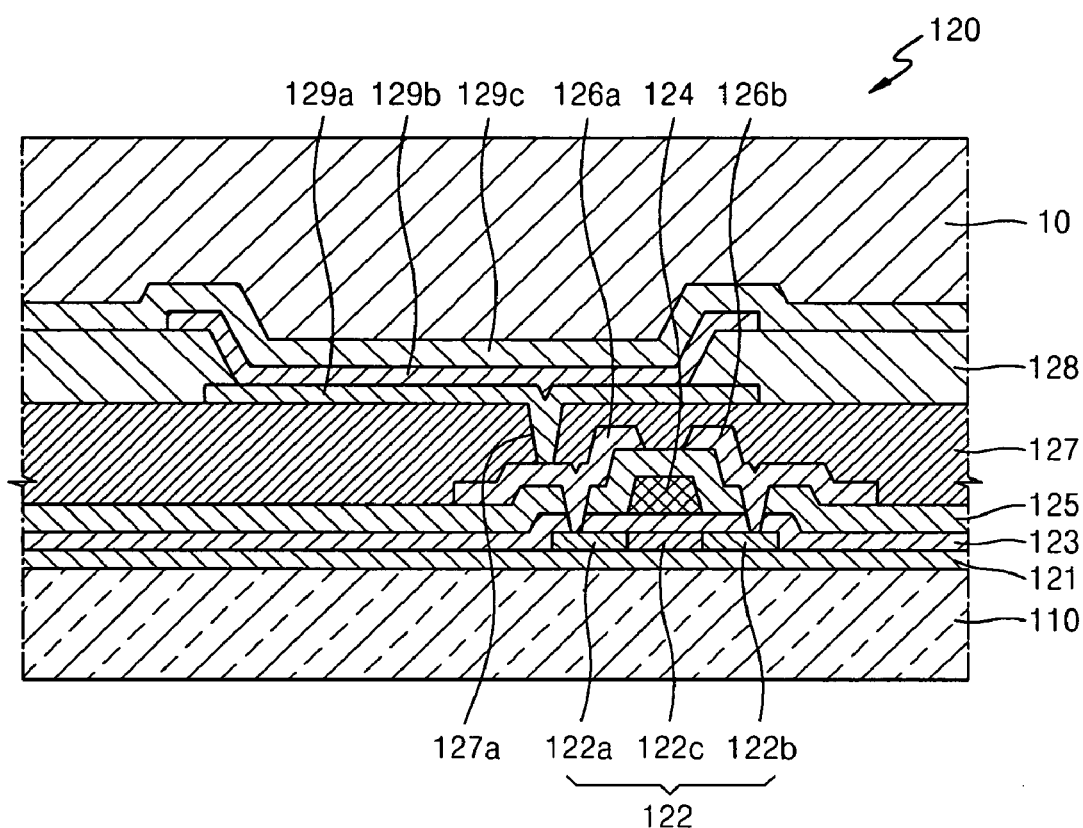
FIG. 13 illustrates a schematic cross-sectional view of a light emitting portion of FIG. 1 according to an exemplary embodiment.

FIG. 13 illustrates a schematic cross-sectional view of a pixel of the light emitting portion 120 according to an exemplary embodiment. Referring to FIG. 13, an insulation layer 121, such as a barrier layer and/or a buffer layer, may reduce and/or prevent impurity ions and moisture and/or external air from penetrating into the first substrate 110. The insulation layer 121 may planarize the surface of the first substrate 110 may be formed on the upper surface of the first substrate 110.

An active layer 122, e.g., a thin film transistor (TFT) and/or a layer formed of a semiconductor layer, may be formed on the insulation layer 121. The active layer 122 may be formed of, e.g., an organic semiconductor or an inorganic semiconductor such as amorphous silicon or polysilicon. The active layer 122 may include a source region 122a, a drain region 122b, and a channel region 122c disposed between the source region 122a and the drain region 122b.

A gate insulation layer 123 may be formed on the active layer 122. A gate electrode 124 may be formed on the gate insulating layer 123. An interlayer insulating layer 125 may be formed on the gate electrode 124. A source electrode 126a and a drain electrode 126b may be formed on the interlayer insulating layer 125. A planarizing layer 127 and a pixel defining layer 128 may be sequentially formed on the source electrode 126a and the drain electrode 126b.

The gate insulation layer 123, the interlayer insulating layer 125, the planarizing layer 127, and the pixel defining layer 128 may be formed as, e.g., insulators, may have a structure of a single layer or multiple layers, and/or may be formed of organic materials, inorganic materials, or compounds of organic and inorganic materials.

A pixel electrode 129a that is, e.g., an electrode of an organic light emitting diode (OLED), may be formed on the upper portion of the planarizing layer 127. The pixel defining layer 128 may be formed on the upper portion of the pixel electrode 129a. A predetermined opening may be formed in the pixel defining layer 128 through which the pixel electrode 129a is exposed and thus an organic light emitting layer 129b of the OLED may be formed. The stacking structure of the TFT is not limited thereto and the TFT may have various structures.

The OLED flat panel apparatus may display predetermined image information by emitting light of, e.g., red, green, and blue according to a current flow. The OLED apparatus may include the pixel electrode 129a that contacts the drain electrode 126b of the TFT through a contact hole, a facing electrode 129c that covers all pixels, and the organic light emitting layer 129b that is disposed between the pixel electrode 129a and the facing electrode 129c and emits the light.

The pixel electrode 129a and the facing electrode 129c may be insulated from each other by the organic light emitting layer 129b and allow the organic light emitting layer 129b to emit the light by applying voltages having different polarities to the organic light emitting layer 129b.

The organic light emitting layer 129b may use a low or high molecular light emitting layer. The organic light emitting layer 129b may have a single or compound structure including a hole injection layer (HIL), a hole transport layer (HTL), an emission layer (EML), an electron transport layer (ETL), an electron injection layer (EIL), etc. The organic light emitting layer 129b may include various organic materials such as at least one of copper phthalocyanine (CuPc), N,N'-Di(naphthalene-1-yl)-N,N'-diphenyl-benzidine (NPB), (tris-8-hydroxyquinoline aluminum)(Alq3), etc. These organic layers may be formed of a vacuum deposition method, etc. The HIL, the HTL, the EML, the ETL, and the EIL may be common layers and may be commonly applied to red, green, and blue pixels. Therefore, differently from FIG. 2, these common layers may cover all pixels, like the facing electrode 129c.

The pixel electrode 129a acts as an anode electrode, and the facing electrode 129c acts as a cathode electrode. The pixel electrode 129a and the facing electrode 129c may have opposite polarities.

If the light emitting portion 120 is a bottom emission type in which, e.g., an image is formed in a direction of the first substrate 110, the pixel electrode 129a may be a transparent electrode, and the facing electrode 129c may be a reflective electrode. In this regard, the pixel electrode 129a may be formed of at least one of ITO, IZO, ZnO, and In2O3 having a high work function, and the facing electrode 129c may be formed of a metal having a low work function, such as at least one of Ag, Mg, Al, Pt, Pd, Au, Ni, Nd, Ir, Cr, Li, and Ca.

If the light emitting portion 120 is a top emission type in which an image is formed in a direction of the second substrate 150, the pixel electrode 129a may be the reflective electrode, and the facing electrode 129c may be the transparent electrode. In this regard, the pixel electrode 129a may include a reflective layer formed of at least one Ag, Mg, Al, Pt, Pd, Au, Ni, Nd, Ir, Cr, Li, Ca and a compound thereof and may be formed of at least one ITO, IZO, ZnO, and $In_2O_3$ having a high work function, and the facing electrode 129c may be deposited by using a metal having a low work function, such as at least one of Ag, Mg, Al, Pt, Pd, Au, Ni, Nd, Ir, Cr, Li, Ca and a compound thereof, and form an auxiliary conductive layer or a bus electrode line formed of a transparent conductive material, such as at least one of ITO, IZO, ZnO, or $In_2O_3$.

If the light emitting portion 120 is a surface emission type, both the pixel electrode 129a and the facing electrode 129c may be the transparent electrodes.

If the first substrate 110 is seated in a frame (not shown), the light emitting portion 120 may be the top emission type in which, e.g., an image is formed in a direction of the second substrate 150. Although not shown, if a predetermined opening is formed in the frame (not shown) and a bottom surface of the first substrate 110 is exposed through the opening, the light emitting portion 120 may be the bottom emission type and the top emission type.

The materials of the pixel electrode 129a and the facing electrode 129c are not limited thereto. The pixel electrode 129a and the facing electrode 129c may be formed of a conductive organic material or a conductive paste including conductive particles such as at least one Ag, Mg, Cu, etc. Such a conductive paste may use an inkjet printing method to perform printing, and then may be baked to form an electrode.

A passivation layer 10 is formed on the upper surface of the facing electrode 129c of the light emitting portion 120. The passivation layer 10 may be formed of an inorganic material, an organic material, or an inorganic and organic compound laminate.

Figure 14:
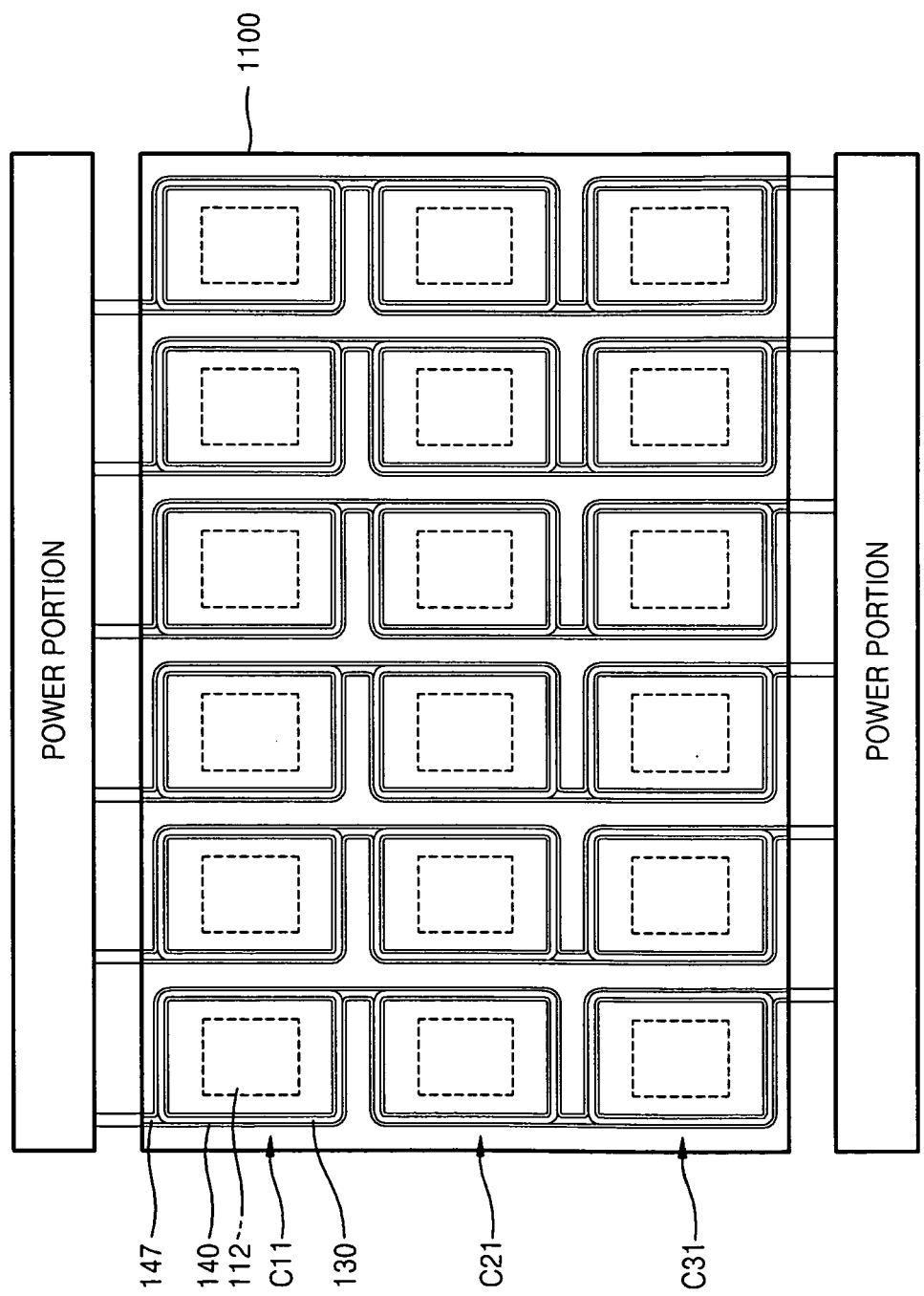
FIG. 14 illustrates a plan view of a mother substrate for a flat panel display apparatus, according to an exemplary embodiment.

FIG. 14 illustrates a plan view of a mother substrate 1100 for a flat panel display apparatus, according to an exemplary embodiment. The mother substrate 1100 for the flat panel display apparatus of the present embodiment may be a mother substrate for an organic light emitting display apparatus, a mother substrate for a LCD, etc. Hereinafter, the mother substrate 1100 for the flat panel display apparatus of the present embodiment is referred to as a mother substrate for the organic light emitting display apparatus for ease of explanation.

Referring to FIG. 14, a plurality of display regions 112 may be formed on the mother substrate 1100 for the flat panel display apparatus. The number of the display regions 112 may vary according to the size of the mother substrate 1100 for the flat panel display apparatus and sizes and number of flat panel display apparatuses. Thus, the embodiments not limited to the number and shape of the display regions 112 of FIG. 14.

The groove portions 160 may be spaced apart from each other by a predetermined gap in the boundaries of the display regions 112. The groove portions 160 may correspond to regions where the bonding members 130 are to be formed, and the bonding members 130 may be accommodated in the groove portions 160. The method of forming the groove portions 160, cross-sectional shapes thereof, and depths thereof have been sufficiently described and thus redundant detailed descriptions will not be repeated. A minute structure, such as a concavo-convex or protrusion, may be formed on the surface of the groove portions 160 in order to increase a contact area between the groove portions 160 and the wiring portions 140.

The wiring portions 140 are disposed in the groove portions 160. The wiring portions 140 contact the bonding members 130 that are to be accommodated in the groove portions 160 and supply heat to the bonding members 130. As described with reference to FIGS. 9 through 12, the wiring portions 140 may include at least one wiring member 141 that may be spaced apart from each other. The wiring member 141 may be formed in bottom surfaces and sidewalls of the groove portions 160. Meanwhile, the wiring portions 140 may further include intermediate layers to cover the wiring members 141. In this regard, the bonding members 130 may contact the intermediate layers.

The wiring portions 140 may include the additional wiring portions 147. The additional wiring portions 147 may be connected to power portions that supply power or may be connected to the adjacent wiring portions 140. Grooves or trenches corresponding to the additional wiring portions 147 may be formed in the mother substrate 1100 for the flat panel display apparatus. The materials, shapes, and thicknesses of the wiring portions 140 and the shapes and number of the additional wiring portions 147 have been sufficiently described and thus redundant detailed descriptions will not be repeated.

The characteristics of the mother substrate 1100 for the flat panel display apparatus of the present embodiment are as follows. A plurality of cells may be formed in the mother substrate 1100 for the flat panel display apparatus. A cell may be a unit forming a flat panel display apparatus, and may include one display region 112, one groove portion 160, one wiring portion 140, and one bonding member 130. The wiring portions 140 included in the mother substrate 1100 for the flat panel display apparatus of the present embodiment may be connected to each other vertically and horizontally through the additional wiring portions 147. Such shapes of the wiring portions 140 allow a sealing process to be simultaneously performed in the cells even though power is not supplied to the wiring portion 140 of the respective cells. For example, the wiring portion 140 included in a cell 11 (C11), a cell 21 (C21) disposed in a vertical direction, and the wiring portion 140 included in a cell 31 (C31) may be connected to the additional wiring portions 147. Thus, the cells 11 and 31 (C11 and C31) may transfer power from a power portion to the cell 21 (C21), and thus a sealing process may be simultaneously performed on the cell 21 (C21) and the cells 11 and 31 (C11 and C31) even though power is not supplied to the cell 21 (C21). A sealing process may be simultaneously performed on the cells included in the mother substrate 1100 for the flat panel display apparatus of the present embodiment, thereby reducing processing time and improving processing efficiency.

According to another embodiment, the intermediate layer 145 may be further formed on the wiring portions 140. The intermediate layer 145 may be formed of a material having a great thermal conductivity in such a way, e.g., that heat generated from the wiring portions 140 may be efficiently transferred to the bonding members 130. According to another embodiment, the intermediate layer 145 may be formed as an insulator to increase a bonding force between the wiring portions 140 and the bonding members 130, and reduce and/or prevent the wiring portions 140 from being oxidized. The material, shape, and thickness of the intermediate layer 145 have been sufficiently described and thus redundant detailed descriptions will not be repeated.

According to another embodiment, the mother substrate 1100 for the flat panel display apparatus of the present embodiment may further include the bonding members 130 that are disposed in the groove portions 160, contacting the wiring portions 140, and that bond the facing substrate 1500 and the mother substrate 1100 for the flat panel display apparatus by using, e.g., the heat supplied from the wring portions 140.

FIG. 15 is a plan view of the mother substrate 1100 for the flat panel display apparatus and the facing substrate 1500 facing the mother substrate 1100 in a bonding state, according to an exemplary embodiment. Referring to FIG. 15, the mother substrate 1100 for the flat panel display apparatus in which the wiring portion 140 is formed may be greater than the facing substrate 1500 in which the wiring portion 140 is not formed since the additional wiring portion 147 of the mother substrate 1100 for the flat panel display apparatus in which the wiring portion 140 is formed contacts the power portion.

The mother substrate 1100 for the flat panel display apparatus of FIGS. 14 and 15 may be a mother substrate including a plurality of the first substrates 110 of FIG. 1. Furthermore, the facing substrate 1500 may be a mother substrate including a plurality of the second substrates 150 of FIG. 1. However, the embodiments are not limited thereto. The mother substrate 1100 for the flat panel display apparatus may be the mother substrate including the second substrates 150 of FIG. 1, and the facing substrate 1500 may be the mother substrate including the first substrates 110 of FIG. 1.

The display regions 112 of FIGS. 14 and 15 may be regions where the light emitting portions 120 are disposed if the mother substrate 1100 for the flat panel display apparatus of FIGS. 14 and 15 is the mother substrate including the first substrates 110 of FIG. 1. Meanwhile, the display regions 112 of FIGS. 14 and 15 may be regions facing the regions where the light emitting portions 120 are disposed if the mother substrate 1100 for the flat panel display apparatus of FIGS. 14 and 15 is the mother substrate including the second substrates 150 of FIG. 1.

As described above, the flat panel display apparatus 100 and the mother substrate including the first substrates 110 of exemplary embodiments may have at least one of the following unique effects. The wiring portion 140 may be formed so that the bonding member 130 may be used to bond a substrate and another substrate facing the substrate to each other by using heat generated from the wiring portion 140. Thus, conventionally expensive laser equipment may be unnecessary, and the bonding member 130 may be only locally heated without affecting an internal element such as a light emitting element. Furthermore, the bonding member 130 may use a thermal baking member instead of a conventional laser hardening member. The thermal baking member may be more stable than the laser hardening member in terms of a penetrability of oxygen and moisture, and has a longer lifespan than the laser hardening member.

Without intending to be bound by this theory, the wiring portion 140 may be formed in the groove portion 160, and the bonding member 130 may contact the wiring portion 140 in the groove portion 160 so that a contact surface between the bonding member 130 and a substrate increases, thereby increasing a bonding force therebetween. Such an increase in the bonding force may improve mechanical strength and/or reliability of impact resistance. In this regard, a panel pull test shows that the increase in the contact surface between the bonding member 130 and the substrate results in an improvement in the characteristics of the panel.

The embodiments disclosed herein circumvent a need for a sealing process that may be time consuming and may be costly by requiring expensive laser equipment. The exemplary embodiments also provide a sealing process that effectively protects a panel from external moisture and that may enhance a lifetime of the panel.

As described above, according to exemplary embodiments, the Joule heat may be used to perform a sealing process, thereby issues that occur in the conventional sealing process using a laser may be by-passed.

A wiring portion may be buried in a groove portion, so that a contact area between a bonding member that is partially buried in the groove portion and a substrate increases, resulting in an increase in an adhesive force therebetween. Accordingly, mechanical strength and reliability of impact resistance increase. In addition, a bonding uniformity between the bonding member and the substrate is controlled.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display apparatus, comprising:
a first substrate including a display region;
a second substrate facing the first substrate, the second substrate being bonded to the first substrate;
a groove portion in an edge of at least one of the first substrate and the second substrate; and
a wiring portion and a bonding member arranged in the groove portion, the bonding member and the wiring portion contacting each other within the groove portion, wherein:
the wiring portion is configured to receive power and to supply heat to the bonding member, and
the bonding member is configured to bond the first substrate and the second substrate when the heat is supplied from the wiring portion.

2. The apparatus as claimed in claim 1, wherein:
the groove portion includes a first groove portion in the edge of the first substrate and a second groove portion in the edge of the second substrate, and
the wiring portion is disposed in the first groove portion and the second groove portion.

3. The apparatus as claimed in claim 1, wherein parts of both the wiring portion and the bonding member are embedded together within the groove portion to be in a touching relationship with respect to each other.

4. The apparatus as claimed in claim 1, wherein a miniature structure is arranged on a surface of the groove portion.

5. The apparatus as claimed in claim 1, wherein the wiring portion includes an additional wiring portion connected to a power portion that is configured to apply the power to the wiring portion.

6. The apparatus as claimed in claim 5, wherein a groove or trench corresponding to the additional wiring portion is arranged in the first substrate and the second substrate.

7. The apparatus as claimed in claim 1, wherein:
a light emitting portion is disposed in the display region, and
the flat panel display apparatus is an organic light emitting display apparatus.

8. The apparatus as claimed in claim 1, wherein:
the wiring portion includes a plurality of wiring members, and
the plurality of wiring members are spaced apart from each other, the bonding member being embedded between the plurality of wiring members.

9. The apparatus as claimed in claim 8, wherein at least one wiring member of the plurality of wiring members is disposed on a bottom surface and a sidewall of the groove portion.

10. The apparatus as claimed in claim 9, further comprising an intermediate layer covering the at least one wiring member, the bonding member contacting the intermediate layer.

11. A mother substrate for a flat panel display apparatus and bonded to a facing substrate, the mother substrate comprising:
a plurality of display portions;
a plurality of groove portions in edges of the plurality of display portions; and
a plurality of wiring portions arranged in the plurality of groove portions, the plurality of wiring portions being configured to receive power and to apply heat to a plurality of bonding members, the plurality of bonding members contacting the plurality of wiring portions within the plurality of groove portions, respectively,
wherein the plurality of wiring portions include a plurality of additional wiring portions, the additional wiring portions being connected to a power portion that is configured to apply the power or being connected to adjacent wiring portions.

12. The mother substrate as claimed in claim 11 wherein:
the plurality of bonding members are configured to bond the mother substrate for the flat panel display apparatus and the facing substrate with the heat applied by the plurality of wiring portions,
the plurality of groove portions include first groove portions within the mother substrate in each of the plurality of display portions and second groove portions within the facing substrate in each of the plurality of display portions, and
the plurality of wiring portions are disposed in the first groove portions and the second groove portions to be in contacting relationship with the plurality of bonding members therein.

13. The mother substrate as claimed in claim 11, wherein grooves or trenches corresponding to the plurality of additional wiring portions are disposed in the mother substrate for the flat panel display apparatus.

14. The mother substrate as claimed in claim 11, further comprising a plurality of intermediate layers between the plurality of wiring portions and the plurality of bonding members.

15. The mother substrate as claimed in claim 11, wherein a plurality of minute structures are disposed on the surfaces of the plurality of groove portions.

16. The mother substrate as claimed in claim 11, wherein the mother substrate for the flat panel display apparatus is a mother substrate for an organic light emitting display apparatus.

17. The mother substrate as claimed in claim 11, wherein:
the plurality of wiring portions include a plurality of wiring members, and
the plurality of wiring members are spaced apart from each other, the plurality of bonding member being embedded between the plurality of wiring members of the plurality of wiring portions.

18. The mother substrate as claimed in claim 17, wherein at least one wiring member of the plurality of wiring members are disposed in bottom surfaces and sidewalls of the plurality of groove portions.

19. The mother substrate as claimed in claim 18, further comprising a plurality of intermediate layers covering the at least one wiring member, the plurality of bonding members contacting the plurality of intermediate layers.

20. A flat panel display apparatus, comprising:
a first substrate including a display region;
a second substrate facing the first substrate, the second substrate being bonded to the first substrate;
a groove portion that includes a first groove portion in the edge of the first substrate and a second groove portion in the edge of the second substrate; and
a wiring portion arranged in the first groove portion and the second groove portion;
a bonding member arranged in the groove portion, the bonding member contacting the wiring portion, wherein:
the wiring portion is configured to receive power and to supply heat to the bonding member, and
the bonding member is configured to bond the first substrate and the second substrate when the heat is supplied from the wiring portion.

21. The apparatus as claimed in claim 20, wherein:
the wiring portion includes a plurality of wiring members that are spaced apart from each other, and
the plurality of wiring members include at least one first wiring member arranged in the first groove portion and at least one second wiring member arranged in the second groove portion, the at least one first wiring member and the at least one second wiring member crossing each other.

22. The apparatus as claimed in claim 20, wherein:
the wiring portion includes a plurality wiring members that are spaced apart from each other, and
the plurality of wiring members includes at least one first wiring member arranged in the first groove portion and at least one second wiring member arranged in the second groove portion, the at least one first wiring member and the at least one second wiring member facing each other.

* * * * *